(12) United States Patent
Xu et al.

(10) Patent No.: US 11,096,306 B1
(45) Date of Patent: Aug. 17, 2021

(54) SERVER

(71) Applicants: Inventec (Pudong) Technology Corporation, Shanghai (CN); INVENTEC CORPORATION, Taipei (TW)

(72) Inventors: Ji-Peng Xu, Shanghai (CN); Sheng Guo, Shanghai (CN); Hui Zhu, Shanghai (CN); Zhifa Chen, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/901,380

(22) Filed: Jun. 15, 2020

(30) Foreign Application Priority Data

Mar. 19, 2020 (CN) .......................... 202010198008.9

(51) Int. Cl.
*H05K 7/14* (2006.01)
*G06F 1/18* (2006.01)
*H05K 7/20* (2006.01)

(52) U.S. Cl.
CPC ........... *H05K 7/1487* (2013.01); *G06F 1/181* (2013.01); *G06F 1/184* (2013.01); *G06F 1/185* (2013.01); *G06F 1/187* (2013.01); *H05K 7/20172* (2013.01); *H05K 7/20727* (2013.01)

(58) Field of Classification Search
CPC ....................................................... H05K 5/00
See application file for complete search history.

(56) References Cited

U.S. PATENT DOCUMENTS

| 7,200,008 | B1 * | 4/2007 | Bhugra ............... | G11B 25/043 361/679.21 |
| 2014/0204525 | A1 * | 7/2014 | Pecone .................. | G06F 1/187 361/679.33 |

* cited by examiner

*Primary Examiner* — Jerry Wu
(74) *Attorney, Agent, or Firm* — Locke Lord LLP; Tim Tingkang Xia, Esq.

(57) ABSTRACT

The disclosure provides including a casing, a mother board, a hard disk drive module, a fan module, and an expansion module. The casing has a hard disk drive accommodation area, a fan accommodation area, and a motherboard accommodation area located between the hard disk drive accommodation area and the fan accommodation area. The motherboard is disposed in the motherboard accommodation area. The hard disk drive module includes hard disk drives. The fan module includes fans. The expansion module is selectively disposed in the hard disk drive accommodation area with the hard disk drives, or disposed in the fan accommodation area with the fans.

9 Claims, 9 Drawing Sheets

SERVER

CROSS-REFERENCE TO RELATED APPLICATIONS

This non-provisional application claims priority under 35 U.S.C. § 119(a) on Patent Application No(s). 202010198008.9 filed in China on Mar. 19, 2020, the entire contents of which are hereby incorporated by reference.

BACKGROUND OF THE INVENTION

Technical Field of the Invention

The disclosure relates to a server, more particularly to a server available for two different arrangements of internal components.

Description of the Related Art

As computer and information technologies progress, desktop computers, laptop computers or other types of personal computer are widely used in daily life. In addition to the advancement of communication technology, cross-border e-commerce becomes a major trend. But it is found that a server designed to manage all network resources is more reliable and can offer a variety of features not commonly used in the typical personal computers so that the server is better than the personal computers in the aspect of handling massive data occurring in the global e-commerce market.

In a typical server, the hard disk module is arranged at the front side of the sever, and the fan module and expansion module are arranged at the rear side of the server. This arrangement of internal components was fixed when the server is made, thus the user is unable to change it or make any required adjustment.

SUMMARY OF THE INVENTION

The disclosure provides a server available for different arrangements of internal components.

One embodiment of the disclosure provides a server. The server includes a casing, a mother board, a hard disk drive module, a fan module, and an expansion module. The casing has a hard disk drive accommodation area, a motherboard accommodation area, and a fan accommodation area. The motherboard accommodation area is located between the hard disk drive accommodation area and the fan accommodation area. The motherboard is disposed in the motherboard accommodation area. The hard disk drive module includes a plurality of hard disk drives. The fan module includes a plurality of fans. The expansion module is selectively disposed in the hard disk drive accommodation area or the fan accommodation area, such that the server is changeable between a first arrangement and a second arrangement. When the server is in the first arrangement, the expansion module and the hard disk drives are together disposed in the hard disk drive accommodation area, and the fans are disposed in the fan accommodation area. When the server is in the second arrangement, the hard disk drives are disposed in the hard disk drive accommodation area, and the expansion module and the fans are together disposed in the fan accommodation area.

According to the servers as discussed above, when the server is in the first arrangement, the expansion module and the hard disk drives can be together accommodated in the hard disk drive accommodation area of the base, and the fans can be accommodated in the fan accommodation area of the base; when the server is in the second arrangement, the hard disk drives can be accommodated in the hard disk drive accommodation area of the base, and the expansion module and the fans can be together accommodated in the fan accommodation area of the base. This shows that the server is able to offer at least two arrangements of the internal components, providing users more options of server interior arrangement.

BRIEF DESCRIPTION OF THE DRAWINGS

The present disclosure will become more fully understood from the detailed description given hereinbelow and the accompanying drawings which are given by way of illustration only and thus are not limitative to the present disclosure and wherein.

DETAILED DESCRIPTION

Figure 1:
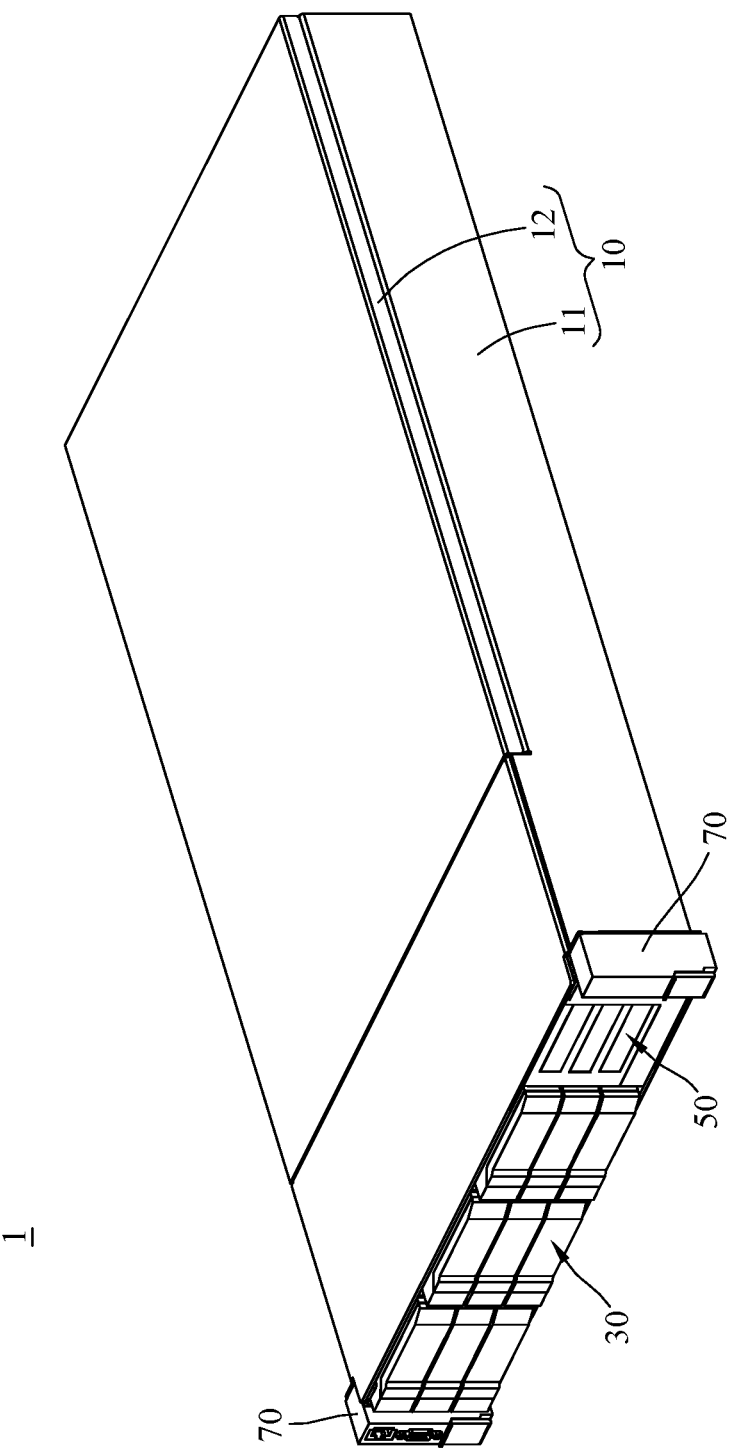
FIG. 1 is a perspective view of a server according to a first embodiment of the disclosure.
Figure 2:
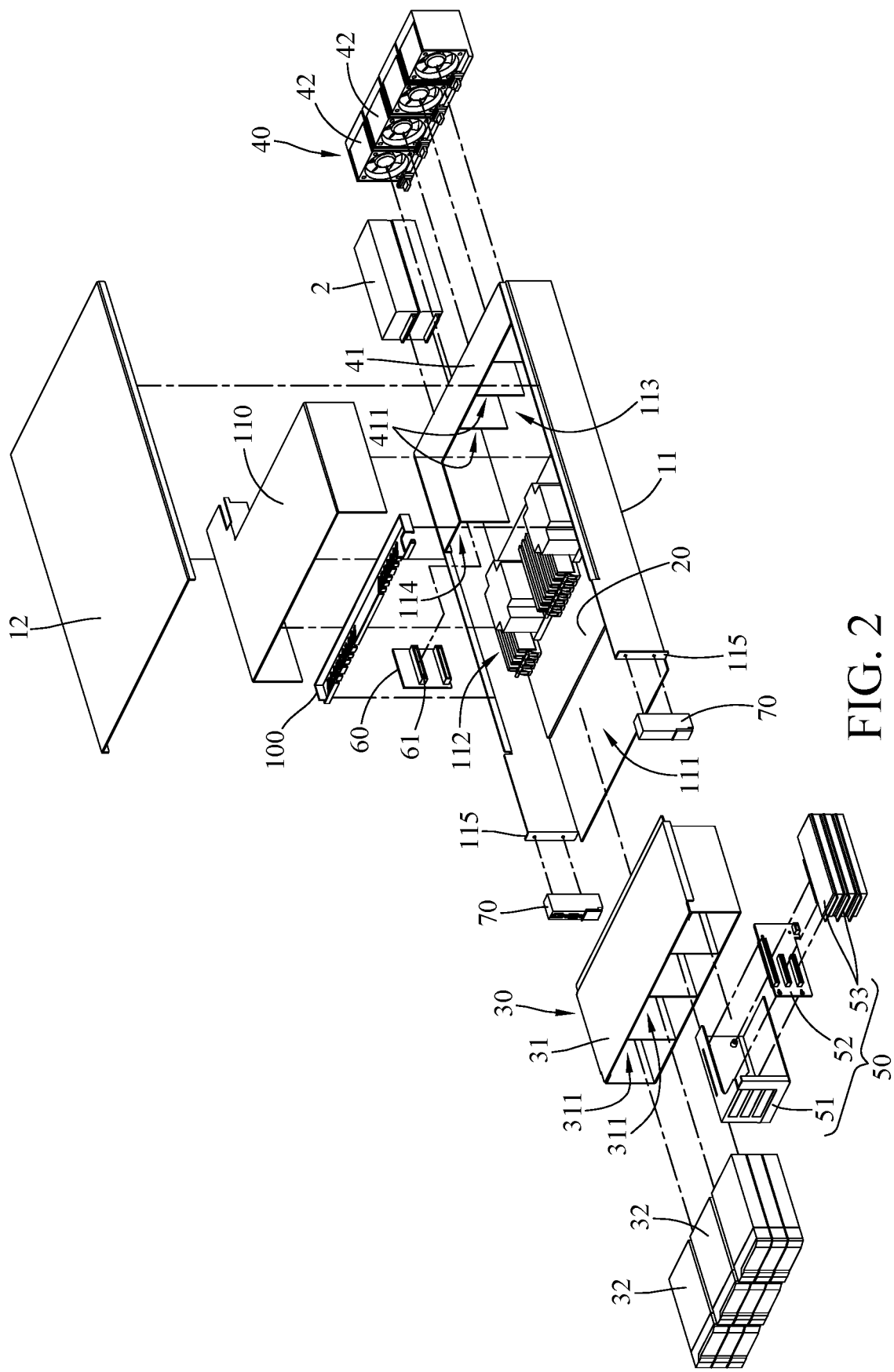
FIG. 2 is an exploded view of the server in FIG. 1.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present disclosure is not limited thereto. Furthermore, for the purpose of illustration, some of the structures and components in the figures are simplified, and wires, reference lines or buses are omitted in some of the figures.

Moreover, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Referring to FIGS. 1 to 4, there are shown a perspective view of a server 1 according to a first embodiment of the disclosure, an exploded view of the server 1 in FIG. 1, a top view of the server in FIG. 1 when a top cover 12 is removed from a base 11, and a partial perspective view of the server 1 in FIG. 1.

In this embodiment, the server 1 includes a casing 10, a motherboard 20, a hard disk drive module 30, a fan module 40, and an expansion module 50.

The casing 10 includes the base 11 and the top cover 12. The base 11 has a hard disk drive accommodation area 111, a motherboard accommodation area 112, and a fan accommodation area 113. The motherboard accommodation area 112 is located between the hard disk drive accommodation area 111 and the fan accommodation area 113. The top cover 12 is mounted on the base 11, and the top cover 12 covers, for example, the motherboard accommodation area 112 and the fan accommodation area 113 of the base 11. The motherboard 20 is disposed in the motherboard accommodation area 112 of the base 11.

The hard disk drive module 30 includes a hard disk drive frame 31 and a plurality of hard disk drives 32. The hard disk drive frame 31 is removably mounted in the hard disk drive accommodation area 111 of the base 11. The hard disk drive frame 31 has a plurality of first accommodation spaces 311 arranged side by side. The first accommodation spaces 311 are configured to accommodate the hard disk drives 32.

The fan module 40 includes a fan frame 41 and a plurality of fans 42. The fan frame 41 is disposed in the fan accommodation area 113 of the base 11. The fan frame 41 has a plurality of second accommodation spaces 411 arranged side by side. The second accommodation spaces 411 are configured to accommodate the fans 42.

The expansion module 50 includes a fixing frame 51, a riser card 52, and a plurality of expansion cards 53. The riser card 52 is fixed on the fixing frame 51, and the expansion cards 53 are inserted into the riser card 52.

In this embodiment, the server 1 further includes a power circuit board 60, two seat bodies 70, a network connector 80, a video graphics array connector 90, a cable management component 100, and a baffle 110. Moreover, the base 11 further has a power accommodation area 114 located aside the fan accommodation area 113 of the base 11.

The power circuit board 60 is disposed in the power accommodation area 114 and is electrically connected to the motherboard 20. The power circuit board 60 has at least one electrical connector 61. The electrical connector 61 is configured for, for example, the insertion of a power supply 2. The power supply 2 is connected to an external power (not shown) via, for example, a power cable (not shown). However, the type of the power supply is not restricted; in some other embodiments, a power supply which have a power supply interface different from that of the power supply 2 may be adopted. For example, such power supply can be connected to the external power via, for example, a copper strip or bar (also called a busbar) disposed in a server rack.

In this embodiment, the base 11 has two bent tab portions 115 respectively located at two opposite sides of the hard disk drive accommodation area 111 of the base 11. The seat bodies 70 are respectively mounted on the bent tab portions 115 of the base 11. The network connector 80 is, for example, a RJ45 socket. The network connector 80 and the video graphics array connector 90 are disposed on one of the seat bodies 70. As such, there are different connectors on the seat body 70.

The cable management component 100 and the baffle 110 are mounted on the base 11 and located in positions corresponding to the motherboard 20. The cable management component 100 is configured to arrange cables in the server 1. The baffle 110 is configured to guide an airflow generated by the fans 42, such that the airflow can be flow toward and concentrated on the motherboard 20 for dissipating heat produced by electronic components on the motherboard 20.

In this embodiment, the expansion module 50 is selectively disposed in the hard disk drive accommodation area 111 or the fan accommodation area 113 of the base 11, such that the server 1 is available for at least two arrangement of the internal components; herein, based on the placement of the expansion module 50, defining that the server 1 is changeable between a first arrangement and a second arrangement. The first arrangement of the server 1 will be described with reference to FIGS. 3 and 5, where FIG. 5 is a front view of the server 1 in FIG. 1.

Figure 3:
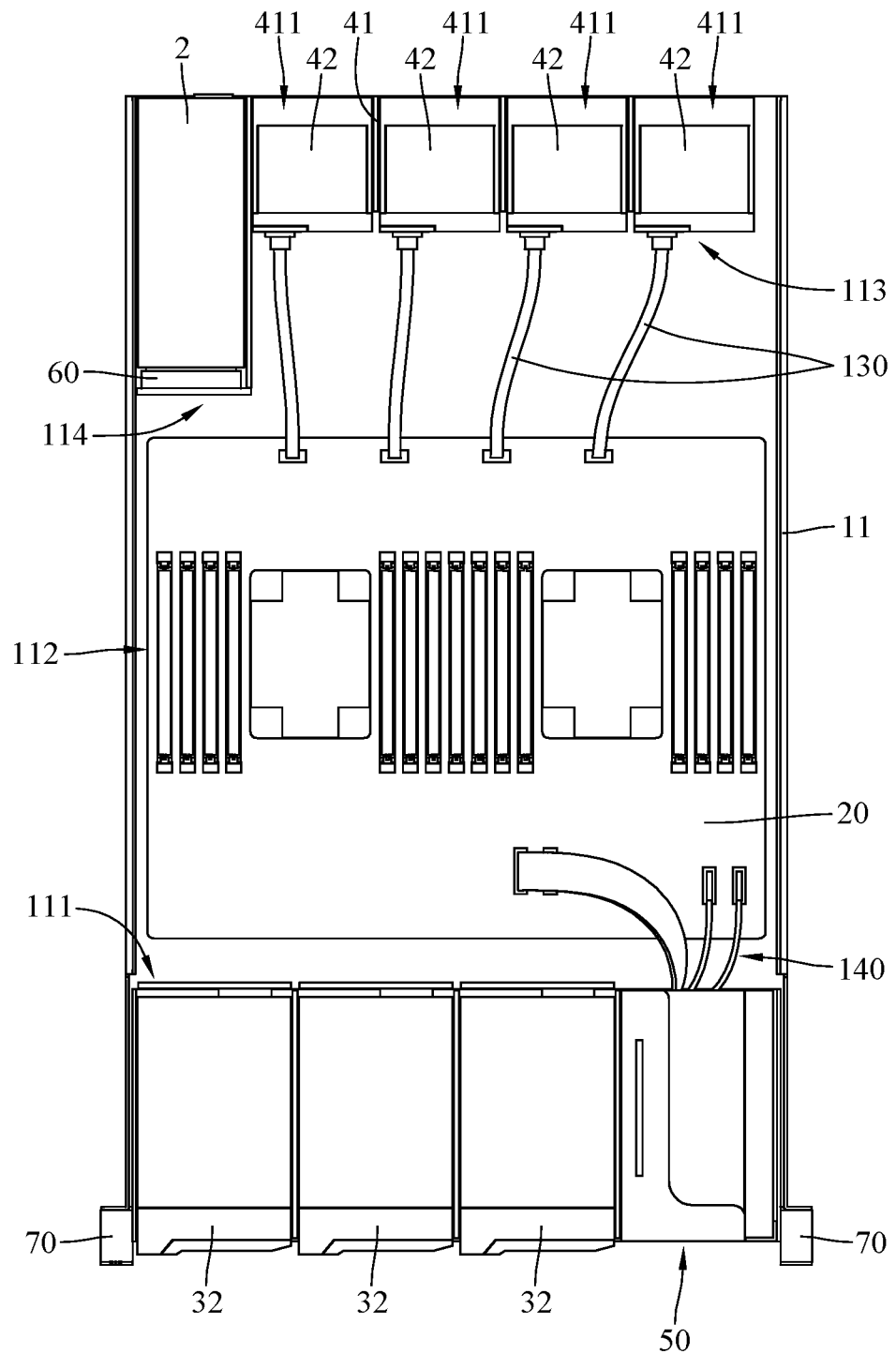
FIG. 3 is a top view of the server in FIG. 1 when a top cover is removed.
Figure 4:
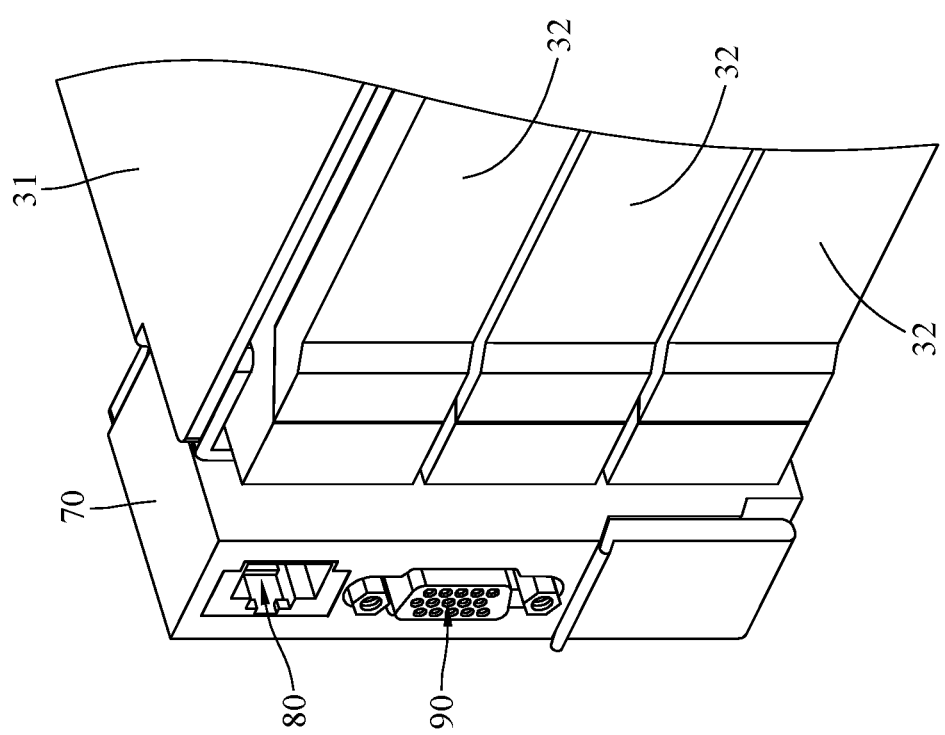
FIG. 4 is a partial perspective view of the server in FIG. 1.
Figure 5:
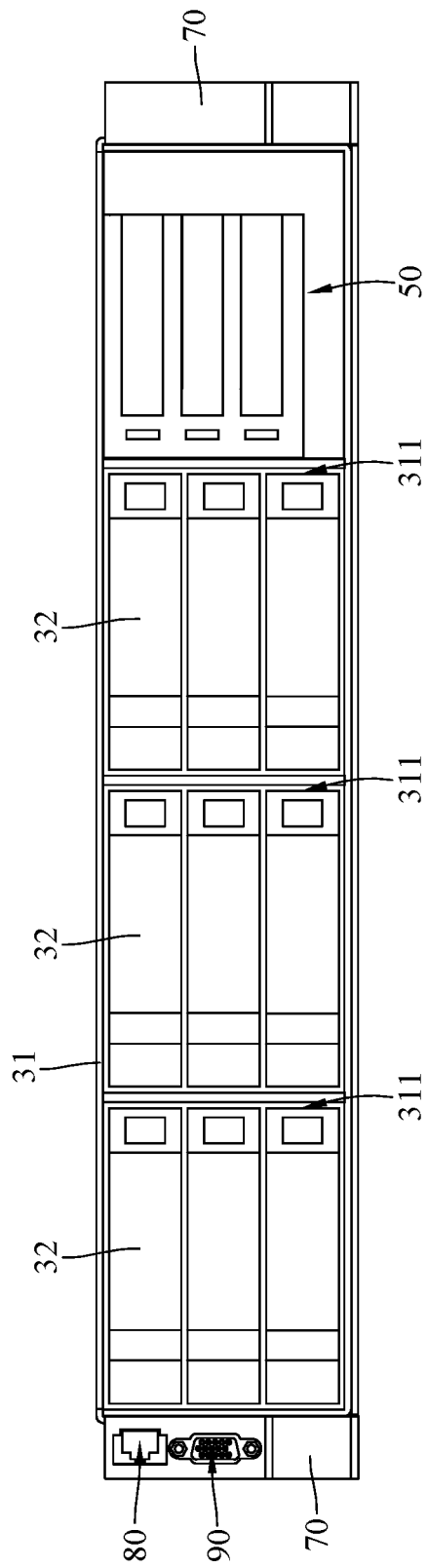
FIG. 5 is a front view of the server in FIG. 1.

As shown in FIGS. 3 and 5, when the server 1 is in the first arrangement, the server 1 is able to accommodate nine 3.5-inch hard disk drives 32 and four fans 42, where the hard disk drives 32 and the expansion module 50 are respectively mounted in the first accommodation space 311 of the hard disk drive frame 31, and the fans 42 are respectively mounted in the second accommodation spaces 411 of the fan frame 41. Specifically, three of the first accommodation spaces 311 of the hard disk drive frame 31 each accommodate three of the hard disk drives 32, the other first accommodation space 311 of the hard disk drive frame 31 accommodates the entire expansion module 50, and each of the second accommodation spaces 411 of the fan frame 41 accommodates one fan 42.

Figure 6:
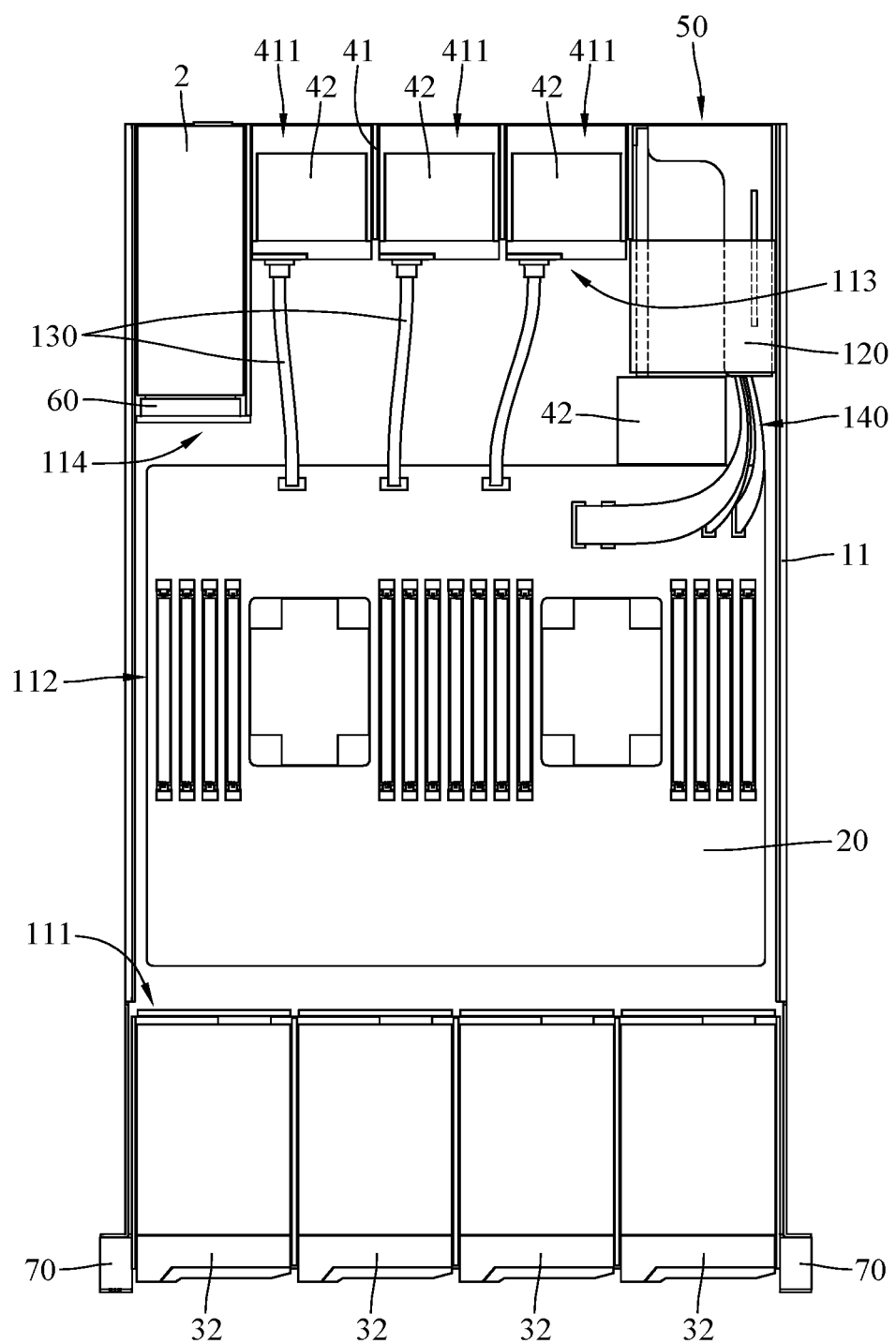
FIG. 6 is a top view of the server in FIG. 3 when the server is in a second arrangement.
Figure 7:
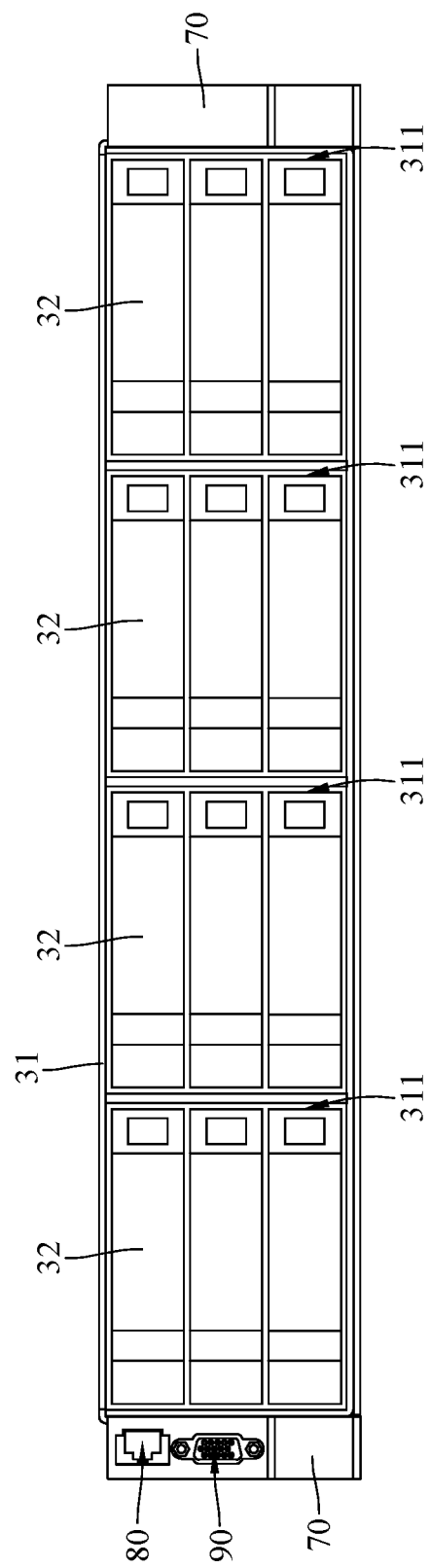
FIG. 7 is a front view of the server in FIG. 6.

Then, referring to FIGS. 6 and 7, there are shown a top view of the server 1 in a second arrangement and a front view of the server 1 in FIG. 6.

As shown in FIGS. 6 and 7, when the server 1 is in the second arrangement, the server 1 has twelve 3.5-inch hard disk drives 32 and four fans 42, where the hard disk drives 32 are respectively mounted in the first accommodation spaces 311 of the hard disk drive frame 31, and some of the fans 42 and the expansion module 50 are respectively mounted in the second accommodation spaces 411 of the fan frame 41. Specifically, the first accommodation spaces 311 of the hard disk drive frame 31 each accommodate three hard disk drives 32, three of the second accommodation spaces 411 of the fan frame 41 each accommodate one fan 42, and the other second accommodation space 411 of the fan frame 41 accommodates the expansion module 50. The other fan 42 is located closer to the motherboard 20 than the expansion module 50 and is configured to generate airflow for dissipating heat generated by the expansion module 50. In this embodiment, the server 1 may further include another baffle 120 that is disposed on the expansion module 50 and can guide the airflow generated by the fan 42 toward the expansion module 50.

In short, in this embodiment, when the server 1 is in the first arrangement, the expansion module 50 and the hard disk drives 32 can be together accommodated in the hard disk drive accommodation area 111 of the base 11, and the fans 42 can be accommodated in the fan accommodation area 113 of the base 11; when the server 1 is in the second arrangement, the hard disk drives 32 can be accommodated in the hard disk drive accommodation area 111 of the base 11, and the expansion module 50 and the fans 42 can be together accommodated in the fan accommodation area 113 of the base 11. This shows that the server 1 is able to offer at least two arrangements of the internal components, providing users more options of server interior arrangement.

Note that the quantity of the fans 42 that can be accommodated in the server 1 is not restricted when in the second arrangement; in some other embodiments, the fan corresponding to the expansion module may be removed so that there are only three fans remain in the server and therefore the baffle will become optional.

Whether the server 1 is in the first or second arrangement, the fan 42 and the riser card 52 of the expansion module 50 are electrically connected to the motherboard 20 via cables. Taking the first arrangement of the server 1 for instance, as shown in FIG. 3, the server 1 may further include a plurality of cables 130 configured to electrically connect the fans 42 to the motherboard 20. Compared to the fan in the conventional server that requires a fan circuit board to make electrical connection to the motherboard, the usage of cables 130 is much more cost-effective and occupying less space and can avoid the troublesome installation of the fan circuit board.

Figure 8:
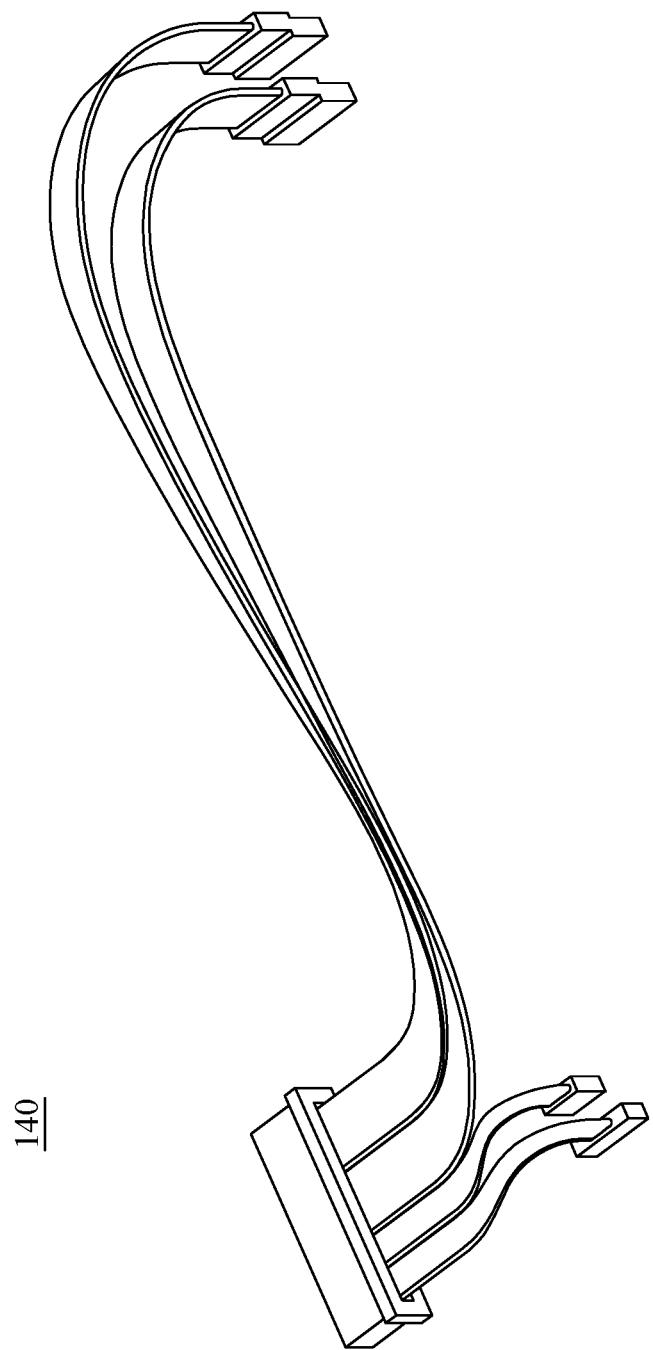
FIG. 8 is a perspective view of a cable of the server in FIG. 1.

In addition, referring to FIG. 3 and further referring to FIG. 8, there is shown a perspective view of a cable 140 of the server 1 in FIG. 1. As shown, the riser card 52 of the expansion module 50 is electrically connected to the motherboard 20 via the cable 140. In FIG. 8, the cable 140 is, for example, a slimline cable, and is able to simultaneously transmit electricity and signals. In this embodiment, compared to that the riser card is typically inserted into a motherboard, the usage of the cable 140 enables a more elastic internal space utilization and saves the connector for the riser card 52 to insert into the motherboard.

Figure 9:
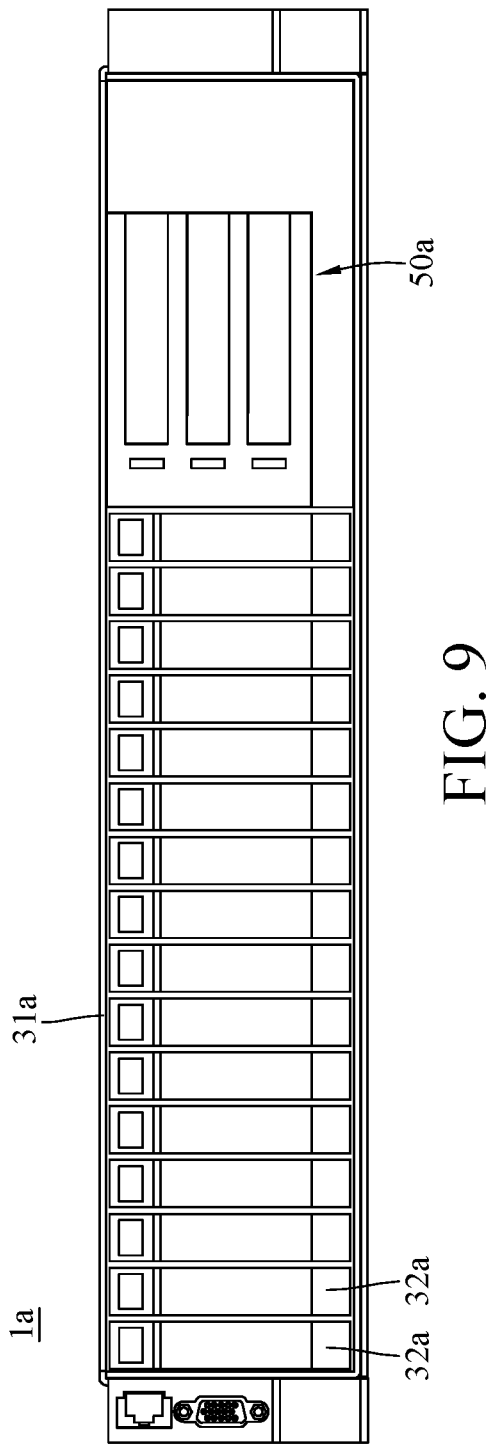
FIG. 9 is a front view of a server according to a second embodiment of the disclosure.
Figure 10:
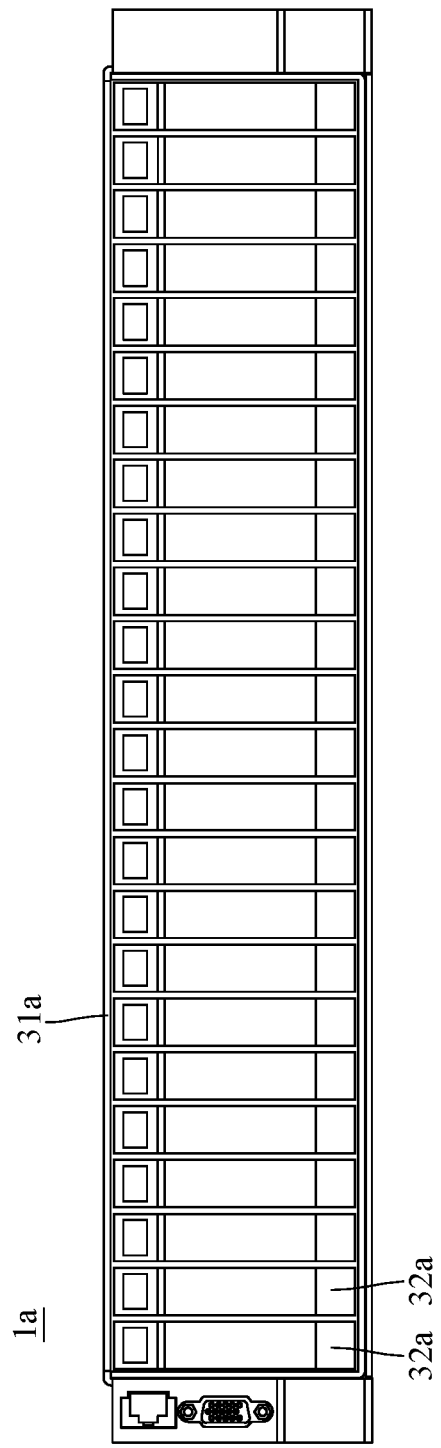
FIG. 10 is a front view of the server in FIG. 9 when the server is in a second arrangement.

Then, referring to FIGS. 9 and 10, there are shown a front view of a server 1a according to a second embodiment of the disclosure and a front view of the server 1a in FIG. 9 when the server 1a is in a second arrangement.

In the following descriptions, for the purpose of clear and simple explanation, the details of structures and components the same as or similar to those in the above descriptions will be omitted, that is, the following descriptions are mainly focused on the differences between this and the aforementioned embodiments and the same and similar parts will not be repeated.

As shown in FIG. 9, when the server 1a is in the first arrangement, a hard disk drive frame 31a is able to accommodate sixteen 2.5-inch hard disk drives 32a and an expansion module 50a. On the other hand, as shown in FIG. 10, when the server 1a is in the second arrangement, the hard disk drive frame 31a is able to accommodate twenty-four 2.5-inch hard disk drives 32a, and the expansion module 50a is accommodated in the second accommodation space 411 of the fan frame 41 (shown in FIG. 6).

According to the servers as discussed in the above embodiments, when the server is in the first arrangement, the expansion module and the hard disk drives can be together accommodated in the hard disk drive accommodation area of the base, and the fans can be accommodated in the fan accommodation area of the base; when the server is in the second arrangement, the hard disk drives can be accommodated in the hard disk drive accommodation area of the base, and the expansion module and the fans can be together accommodated in the fan accommodation area of the base. This shows that the server is able to offer at least two arrangements of the internal components, providing users more options of server interior arrangement.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A server, comprising:
   a casing, having a hard disk drive accommodation area, a motherboard accommodation area, and a fan accommodation area, wherein the motherboard accommodation area is located between the hard disk drive accommodation area and the fan accommodation area;
   a motherboard, disposed in the motherboard accommodation area;
   a hard disk drive module, comprising a plurality of hard disk drives;
   a fan module, comprising a plurality of fans;
   a cable; and
   an expansion module, selectively disposed in the hard disk drive accommodation area or the fan accommodation area, such that the server is changeable between a first arrangement and a second arrangement, wherein the expansion module comprises a plurality of expansion cards and a riser card, the plurality of the expansion cards are insert into the riser card, and the riser card is electrically connected to the motherboard via the cable;
   wherein when the server is in the first arrangement, the expansion module and the plurality of hard disk drives are together disposed in the hard disk drive accommodation area, and the plurality of fans are disposed in the fan accommodation area; when the server is in the second arrangement, the plurality of hard disk drives are disposed in the hard disk drive accommodation area, and the expansion module and the plurality of fans are together disposed in the fan accommodation area.

2. The server according to claim 1, wherein the hard disk drive module comprises a hard disk drive frame, the hard disk drive frame is mounted in the hard disk drive accommodation area of the casing, the hard disk drive frame has a plurality of first accommodation spaces arranged side by side, the fan module comprises a fan frame, the fan frame is mounted in the fan accommodation area of the casing, the fan frame has a plurality of second accommodation spaces arranged side by side; when the server is in the first arrangement, the plurality of hard disk drives and the expansion module are respectively mounted in the plurality of first accommodation spaces, and the plurality of fans are respectively mounted in the plurality of second accommodation spaces; when the server is in the second arrangement, the plurality of hard disk drives are respectively mounted in the plurality of first accommodation spaces, and the plurality of fans and the expansion module are respectively mounted in the plurality of second accommodation spaces.

3. The server according to claim 2, wherein when the server is in the first arrangement, the quantity of the plurality of hard disk drives is nine or sixteen, and the quantity of the plurality of fans is four; when the server is in the second arrangement, the quantity of the plurality of hard disk drives is twelve or twenty-four, and the quantity of the plurality of fans is three.

4. The server according to claim 3, wherein when the server is in the first arrangement, the plurality of hard disk drives are nine 3.5-inch hard disk drives or sixteen 2.5-inch hard disk drives; when the server is in the second arrangement, the plurality of hard disk drives are twelve 3.5-inch hard disk drive or twenty-four 2.5-inch hard disk drives.

5. The server according to claim 2, wherein the hard disk drive frame is removably mounted in the hard disk drive accommodation area of the casing.

6. The server according to claim 1, further comprising two seat bodies and at least one network connector, wherein the casing has two bent tab portions opposite to each other, the bent tab portions are located at two opposite sides of the hard disk drive accommodation area, the seat bodies are respectively mounted on the bent tab portions of the casing, and the at least one network connector is disposed on one of the seat bodies.

7. The server according to claim 1, further comprising a power circuit board, wherein the casing further has a power accommodation area, the power accommodation area is located aside the fan accommodation area, the power circuit board is located at the power accommodation area and is electrically connected to the motherboard, the power circuit board has at least one electrical connector, the at least one electrical connector is configured to be inserted by one of two power supplies, and power supply interfaces of the power supplies are different from each other.

8. The server according to claim 1, further comprising a cable management component, wherein the cable management component is fixed on the casing and corresponds to the motherboard.

9. The server according to claim 1, further comprising a plurality of cables, wherein the plurality of fans are respectively electrically connected to the motherboard via the plurality of cables.

\* \* \* \* \*